(12) United States Patent
Kang et al.

(10) Patent No.: US 9,795,042 B2
(45) Date of Patent: Oct. 17, 2017

(54) DISPLAY APPARATUS

(71) Applicant: SAMSUNG ELECTRONICS CO., LTD., Suwon-si (KR)

(72) Inventors: Han Moog Kang, Seoul (KR); Jin Sung Kim, Hwaseong-si (KR); Seung Kweon Shin, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 61 days.

(21) Appl. No.: 14/844,497

(22) Filed: Sep. 3, 2015

(65) Prior Publication Data

US 2016/0066442 A1    Mar. 3, 2016

(30) Foreign Application Priority Data

Sep. 3, 2014  (KR) ......................... 10-2014-0116789

(51) Int. Cl.
  *H05K 5/00*    (2006.01)
  *B29C 45/73*   (2006.01)
  (Continued)

(52) U.S. Cl.
  CPC ........... *H05K 5/0017* (2013.01); *B29C 45/73* (2013.01); *B29C 45/7312* (2013.01);
  (Continued)

(58) Field of Classification Search
  CPC ............... H05K 5/0017; H05K 5/0004; G02F 1/133308; G02F 2001/133322;
  (Continued)

(56) References Cited

U.S. PATENT DOCUMENTS 9,061,445 B2 *  6/2015  Hinzpeter ............... B29C 33/06
2005/0263673 A1  12/2005  Bachan
(Continued)

FOREIGN PATENT DOCUMENTS

EP    2 664 957 A1   11/2013
JP       5-31725       2/1993
(Continued)

OTHER PUBLICATIONS

Extended European Search Report dated Jan. 29, 2016 in corresponding European Patent Application No. 15183586.5.

*Primary Examiner* — Steven T Sawyer
*Assistant Examiner* — Sagar Shrestha
(74) *Attorney, Agent, or Firm* — Staas & Halsey LLP

(57) ABSTRACT

Disclosed herein is a display apparatus having high quality and high gloss. The display apparatus includes a display module which keeps a display panel on which an image is displayed in a curved surface state, a driving unit provided at a rear side of the display module, and a cover which accommodates the display module and the driving unit and forms an exterior of the display apparatus, wherein the cover is injection molded, and includes a first cover which is disposed in front of the display module and is provided to have the same curvature as that of the display panel, and a second cover which is disposed at the rear side of the display module, is coupled with the first cover, simultaneously accommodates the display module and the driving unit, and is formed to have a curvature which is different from that of the display panel.

11 Claims, 9 Drawing Sheets

(51) Int. Cl.
*B29C 45/14* (2006.01)
*B29C 45/26* (2006.01)

(52) U.S. Cl.
CPC ...... *H05K 5/0004* (2013.01); *B29C 45/14336* (2013.01); *B29C 45/2673* (2013.01)

(58) Field of Classification Search
CPC ..... G02F 2001/133354; B29C 45/7312; B29C 45/73; B29C 45/14336; B29C 45/2673; B29L 2031/3475
USPC .......... 361/679.01, 679.02–679.09, 361/679.21–679.3, 679.46, 361/679.49–679.53, 679.55, 679.56, 361/688–699; 349/58–60
See application file for complete search history.

(56) References Cited

U.S. PATENT DOCUMENTS

| | | | |
|---|---|---|---|
| 2006/0138698 A1 | 6/2006 | Chapuis | |
| 2007/0146616 A1* | 6/2007 | Nouchi | G02F 1/1333 349/155 |
| 2008/0003325 A1* | 1/2008 | Seaver | B22C 9/065 425/552 |
| 2008/0303194 A1* | 12/2008 | Anbarasu | B29C 33/06 264/403 |
| 2009/0161048 A1* | 6/2009 | Satake | G02F 1/133305 349/110 |
| 2009/0289880 A1* | 11/2009 | Byoun | G02F 1/133308 345/87 |
| 2009/0316062 A1* | 12/2009 | Nishizawa | G02F 1/133305 349/58 |
| 2010/0073593 A1* | 3/2010 | Sasaki | B29D 11/00 349/58 |
| 2010/0195040 A1* | 8/2010 | Koganezawa | G02F 1/1333 349/153 |
| 2012/0044618 A1* | 2/2012 | Lee | 361/679.01 |
| 2012/0148699 A1* | 6/2012 | Cho | B29C 45/73 425/143 |
| 2013/0334741 A1* | 12/2013 | Takai | B29C 33/02 264/403 |
| 2014/0009914 A1 | 1/2014 | Cho et al. | |
| 2014/0133073 A1* | 5/2014 | Ahn | H01L 51/5237 361/679.01 |
| 2014/0240906 A1* | 8/2014 | Seo | A47B 81/06 361/679.01 |
| 2014/0268584 A1* | 9/2014 | Song | H05K 7/02 361/728 |
| 2014/0339736 A1* | 11/2014 | Wittenberg | B29C 45/7613 264/328.1 |
| 2015/0047393 A1* | 2/2015 | Luo | C03C 21/002 65/30.14 |
| 2015/0346538 A1* | 12/2015 | Hsiao | G02F 1/133308 349/58 |

FOREIGN PATENT DOCUMENTS

| | | |
|---|---|---|
| JP | 2005-103620 | 4/2005 |
| JP | 2008-542066 | 11/2008 |
| KR | 10-2014-0081941 | 7/2014 |

* cited by examiner

DISPLAY APPARATUS

CROSS-REFERENCE TO RELATED APPLICATIONS

This application claims the benefit of Korean Patent Application No. 2014-0116789, filed on Sep. 3, 2014 in the Korean Intellectual Property Office, the disclosure of which is incorporated herein by reference.

BACKGROUND

1. Field

Embodiments herein relate to a display apparatus.

2. Description of the Related Art

Display apparatuses display images on screens, and typically include television sets or monitors.

A display apparatus includes a display module on which an image is displayed, and a cover provided at an outside of the display module to form an exterior.

Generally, a cover of a display apparatus is formed through injection molding.

Injection molding is one method of shaping a synthetic resin material such as plastics, fills a mold cavity formed in a predetermined shape with a melted resin by injecting, and cools and hardens it, and thus produces a product which has the same shape as the cavity.

Recently, it has been a trend to form the display apparatus in a curved surface or with various designs to meet a user's taste. By the way, in the process in which the display apparatus have had a curved surface or various designs, there is a problem in that it is difficult to form a cover in a curved surface or produce a high gloss cover using a conventional injection molding method.

Since a surface of a product which is formed through injection molding is rough, an additional surface treatment process is needed, and thus there is a problem in that the process become complex.

In addition, in a conventional injection molding, cooling flow paths are partially formed in a curved surface portion of a mold, and are connected to each other using baffles. At this time, there is a problem in that different surface colors or exterior failures occur due to partially concentrated cooling phenomenon in a cooling process of the conventional injection molding.

SUMMARY

Additional aspects and/or advantages will be set forth in part in the description which follows and, in part, will be apparent from the description, or may be learned by practice of the embodiments.

Therefore, it is an aspect of the embodiments to provide a display apparatus having a curved surface which has high gloss and high quality.

It is another aspect of the embodiments to provide a display apparatus which allows production time to be reduced, and thus, its manufacturing cost to be reduced.

It is still another aspect of the embodiments to provide a display apparatus which is injection molded by an injection molding apparatus which allows a cooling temperature distribution to be uniform because cooling lines can be formed close to a curved surface.

Additional aspects of the embodiments will be set forth in part in the description which follows and, in part, will be obvious from the description, or may be learned by practice of the embodiments.

In accordance with one aspect of the embodiments, a display apparatus includes a display module which keeps a display panel on which an image is displayed in a curved surface state, a driving unit provided at a rear side of the display module, and a cover which accommodates the display module and the driving unit and forms an exterior of the display apparatus, wherein the cover is injection molded, and includes a first cover which is disposed in front of the display module and is provided to have the same curvature as that of the display panel, and a second cover which is disposed at the rear side of the display module, is coupled with the first cover, simultaneously accommodates the display module and the driving unit, and is formed to have a curvature which is different from that of the display panel.

The cover may be formed of a plastic resin material.

The cover may be injection molded by an injection molding apparatus, the injection molding apparatus may include a first mold configured to shape the first cover provided to form a front edge of the display apparatus, and a second mold provided to couple with the first mold, and the first mold may include a curved surface core having a curved surface portion which protrudes so that the first cover forms a curved surface having a concave shape recessed in a forward direction, and an insert block which is provided at the curved surface core, and may be provided to form a cooling flow path formed in a shape corresponding to that of the curved surface portion.

The cooling flow path may include a plurality of first cooling flow paths formed in the first mold in a straight line, and a second cooling flow path formed to communicate with the first cooling flow paths by the insert block.

The insert block may include a curved surface shape portion formed to have a curvature corresponding to that of the curved surface portion, and a cooling flow path shape portion formed in the curved surface shape portion.

The first mold may include an insert block installation space which communicates with the first cooling flow path, and the second cooling flow path may be formed by inserting the insert block into the insert block installation space.

The insert block may be formed to be smaller than the insert block installation space.

The cooling flow path may be formed in the curved surface core.

The second cooling flow path may be formed to be spaced a predetermined interval from the curved surface portion.

The cover may be formed in a curved surface shape in which both end portions thereof protrude in a forward direction.

A plurality of gates configured to inject a resin solution may be provided in the second mold.

In accordance with one aspect of the embodiments, a display apparatus a display apparatus injection molded cover may be provided accommodating a curved display and a driving unit where the cover may include a first cover which is positionable at front side of the display module and has a first curvature a same as a display panel curvature of the display panel and a second cover which is positionable at a rear side of the display module, is couplable with the first cover, accommodates the display and the driving unit, and has a second curvature which is different from the first curvature, and where the first cover is cooled while molding using injection molded cooling fluid flow paths curving according to the first curvature.

BRIEF DESCRIPTION OF THE DRAWINGS

These and/or other aspects of the embodiments will become apparent and more readily appreciated from the following description of the embodiments, taken in conjunction with the accompanying drawings of which.

DETAILED DESCRIPTION

Figure 1:
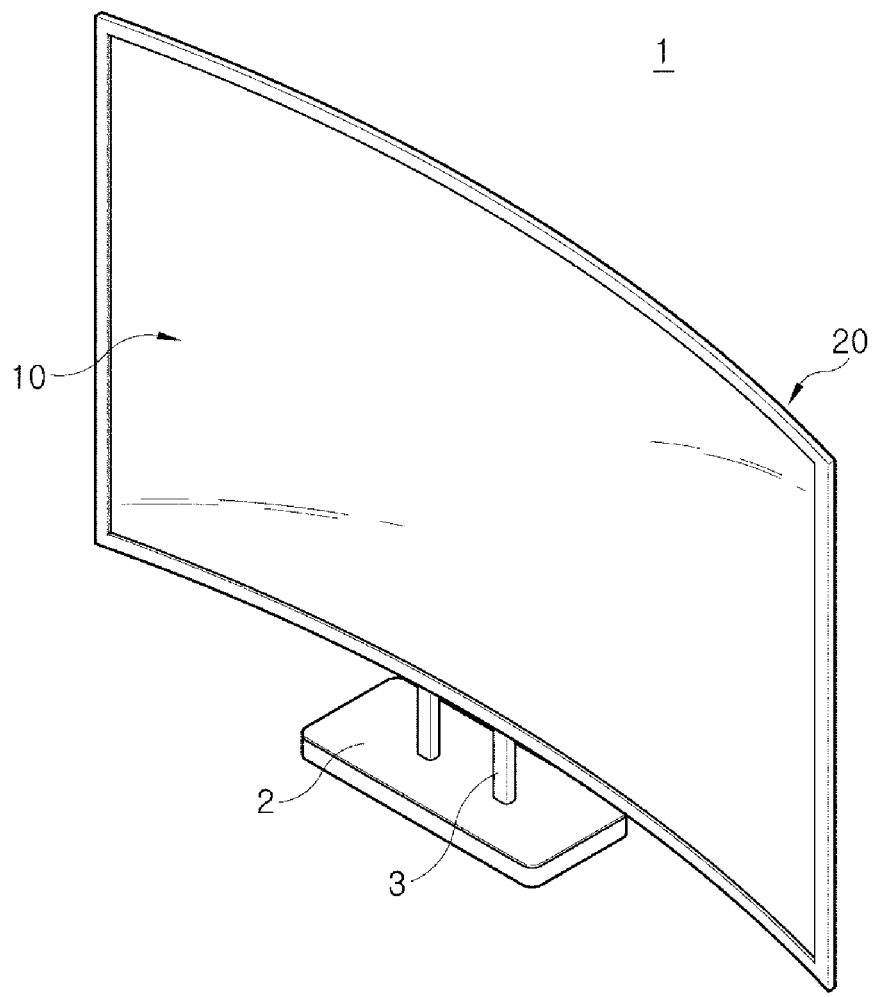
FIG. 1 is a schematic perspective view of a display apparatus according to one embodiment of the embodiments.

Reference will now be made in detail to the embodiments, examples of which are illustrated in the accompanying drawings, wherein like reference numerals refer to like elements throughout.

Hereinafter, embodiments will be described with reference to accompanying drawings in detail.

Figure 2:
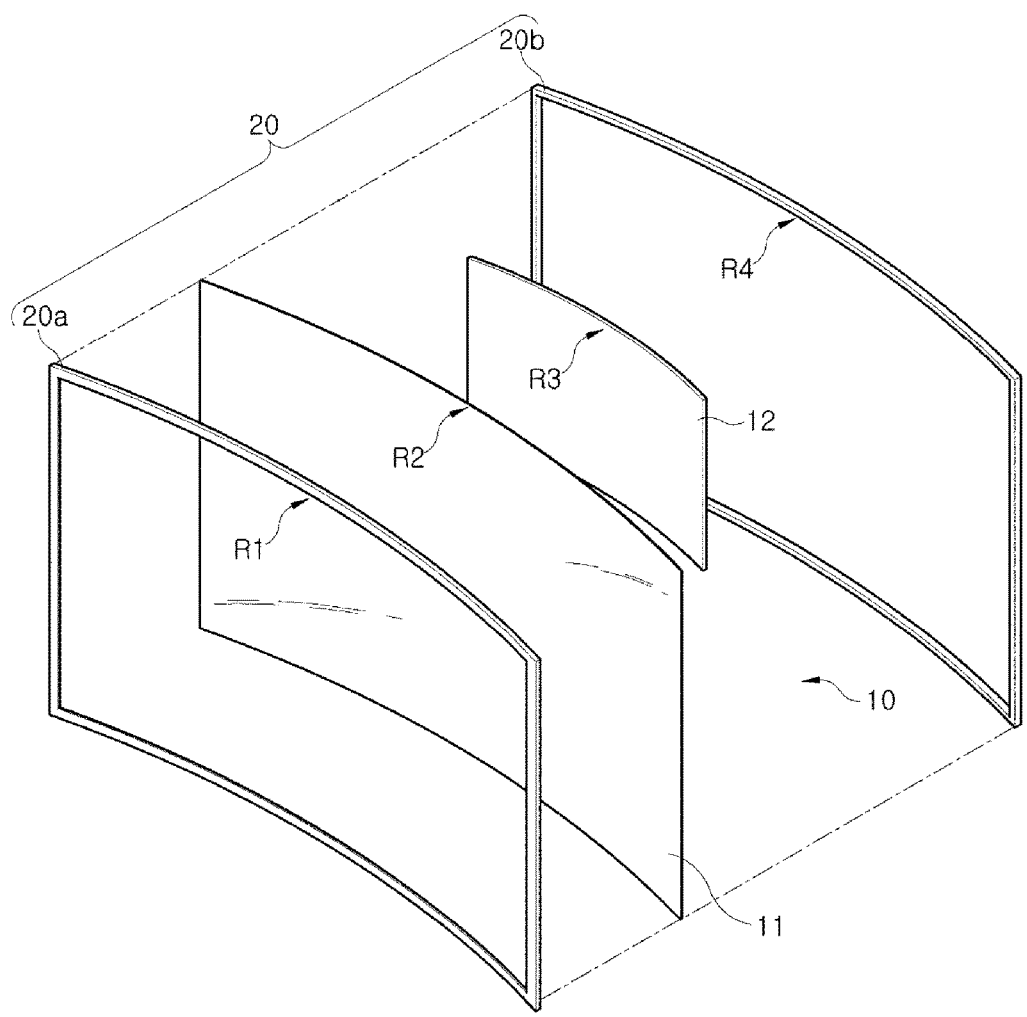
FIG. 2 is an exploded perspective view schematically illustrating a cover of the display apparatus according to one embodiment of the embodiments.

As illustrated in FIGS. 1 to 2, a display apparatus 1 includes a display module 10 on which image information is displayed, and a cover 20 disposed at an outside of the display module 10 to protect the display module 10 and internal electronic parts.

A base 2 is provided below the display module 10 and the cover 20 to be supported by the installation surface (not shown), such as a floor, on which the display apparatus 1 is installed. The display module 10 and the base 2 may be connected to each other through a stand 3 vertically provided on the base 2.

The cover 20 is provided in a curved surface shape by both ends thereof formed to be bent and protrude in a forward direction from the center thereof.

The cover 20 may include a first cover 20a which forms a front edge of the display apparatus 1, and a second cover 20b which is coupled with the first cover 20a and forms a rear of the display apparatus 1.

At this time, the first cover 20a may form a front surface and side surface of the display apparatus 1. In the embodiment, it has been illustrated as an example that the first cover 20a forms at least a part of the side surface of the display apparatus 1, but the concept is not limited thereto. For example, the first cover 20a may also form the entire side surface of the display apparatus 1 or only the front surface and not the side surface thereof.

The display module 10 may include a display panel 11 provided to be or which is flexible, and a driving unit 12 provided to drive the display panel 11.

At this time, the display module 10 may include a self-emitting type display device, such as an organic light emitting diode (OLED), which emits light by electrically exciting fluorescent organic compounds, and a light receiving display device, such as a liquid crystal display (LCD), which needs a separate light source.

In the embodiment, it has been described as an example that the display panel 11 of the display module 10 includes a liquid crystal display panel, and the driving unit 12 includes a back light unit (not shown) separately disposed at a rear side of the liquid crystal display panel, but the concept is not limited thereto.

The liquid crystal display panel includes a thin film transistor substrate (not shown) in which a thin film transistor is formed, a color filter substrate (not shown) which faces the thin film transistor substrate, and a liquid crystal layer (not shown) provided between the thin film substrate and the color filter substrate. One side of the thin film transistor substrate includes a flexible printed circuit board (PCB), a driving chip which is installed on the flexible PCB, and a panel circuit board (not shown) which is in connection with the other side of the thin film transistor substrate.

The liquid crystal display panel can display an image by controlling arrangement of a liquid crystal layer, but, since the liquid crystal display panel cannot emit light by itself, the liquid crystal display panel receives light from a back light unit positioned at a rear thereof to display an image.

Accordingly, the driving unit 12 including the back light unit and the like may be provided at a rear of the display panel 11 of the display module 10.

In addition, the driving unit 12 of the display module 10 may also further include a circuit board, such as a PCB and the like, to drive the display apparatus 1. The driving unit 12 of the display module 10 may be surrounded by the second cover 20b which forms an exterior of the rear of the display apparatus 1.

The cover 20 of the display apparatus 1 may be provided in a curved surface to keep the display module 10 in a curved surface state.

The cover 20 forms a curved surface in which both ends thereof protrude in a forward direction from the center thereof. That is, the cover 20 may be formed in a curved surface state of concave shape in which the center thereof is recessed from the front toward the rear thereof.

At this time, the first cover 20a may have a first curvature R1 corresponding to a second curvature R2 of the display panel 11. The first curvature R1 and the second curvature R2 have the same curvature.

In addition, the second cover 20b may have the same curvature as the second curvature R2 of the display panel 11, or have a fourth curvature R4 including a third curvature R3 of display module 10 including the driving unit 12 disposed at the rear of the display panel 11.

At this time, the fourth curvature R4 of the second cover 20b may also be the same as that of at least one of the second curvature R2 and the third curvature R3.

Meanwhile, the cover 20 which forms the display apparatus 1 is injection molded of a plastic resin material using an injection molding apparatus 100 according to one embodiment.

Figure 3:
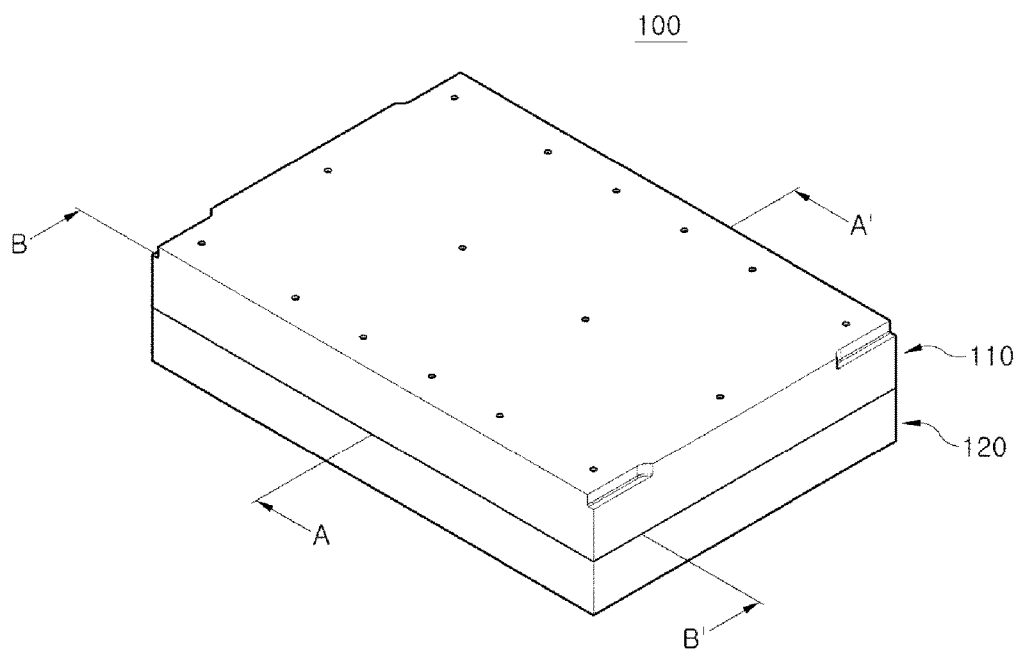
FIG. 3 is a schematic view of an injection molding apparatus used for manufacturing of the display apparatus according to one embodiment of the embodiments.
Figure 4:
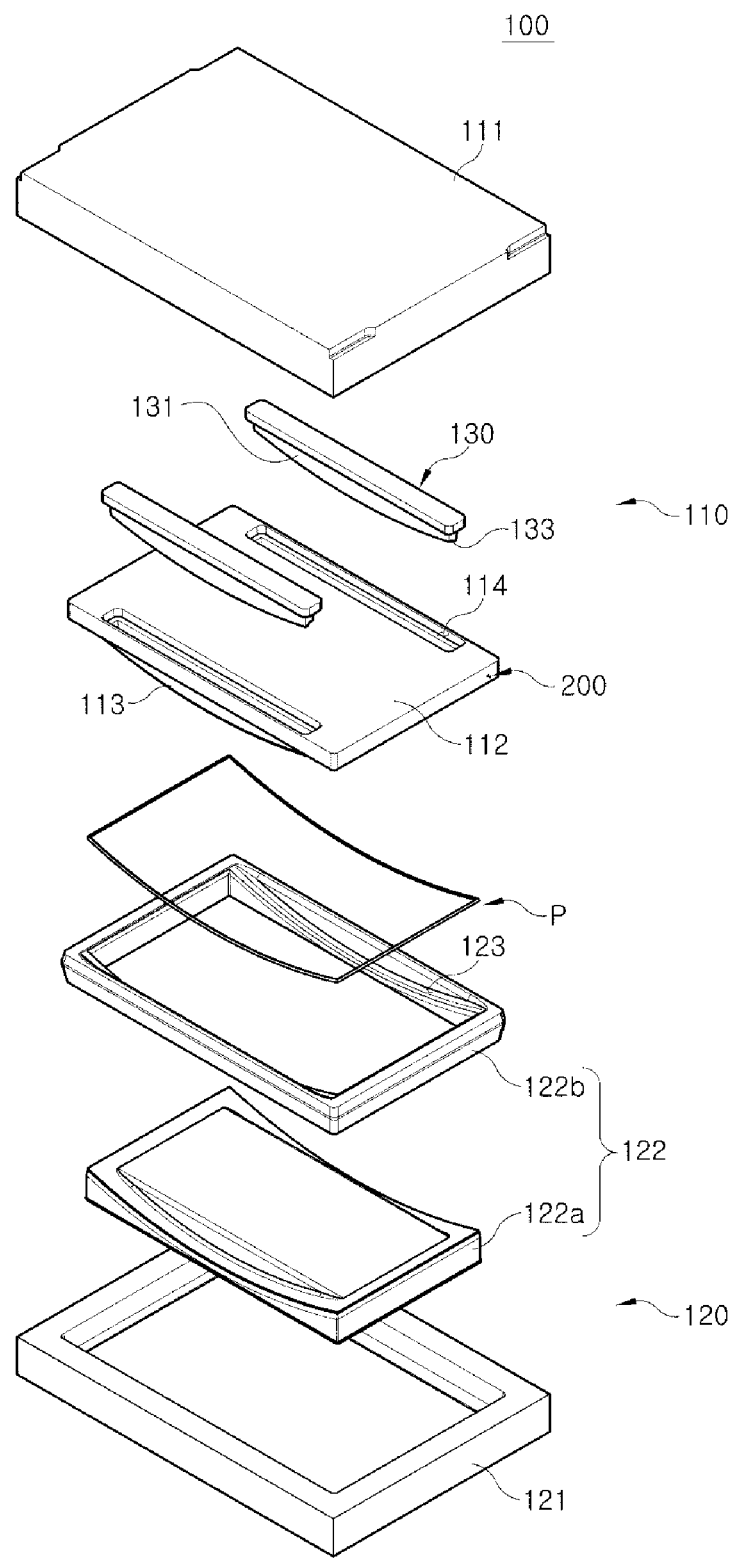
FIG. 4 is an exploded perspective view schematically illustrating the injection molding apparatus according to one embodiment of the embodiments.
Figure 5:
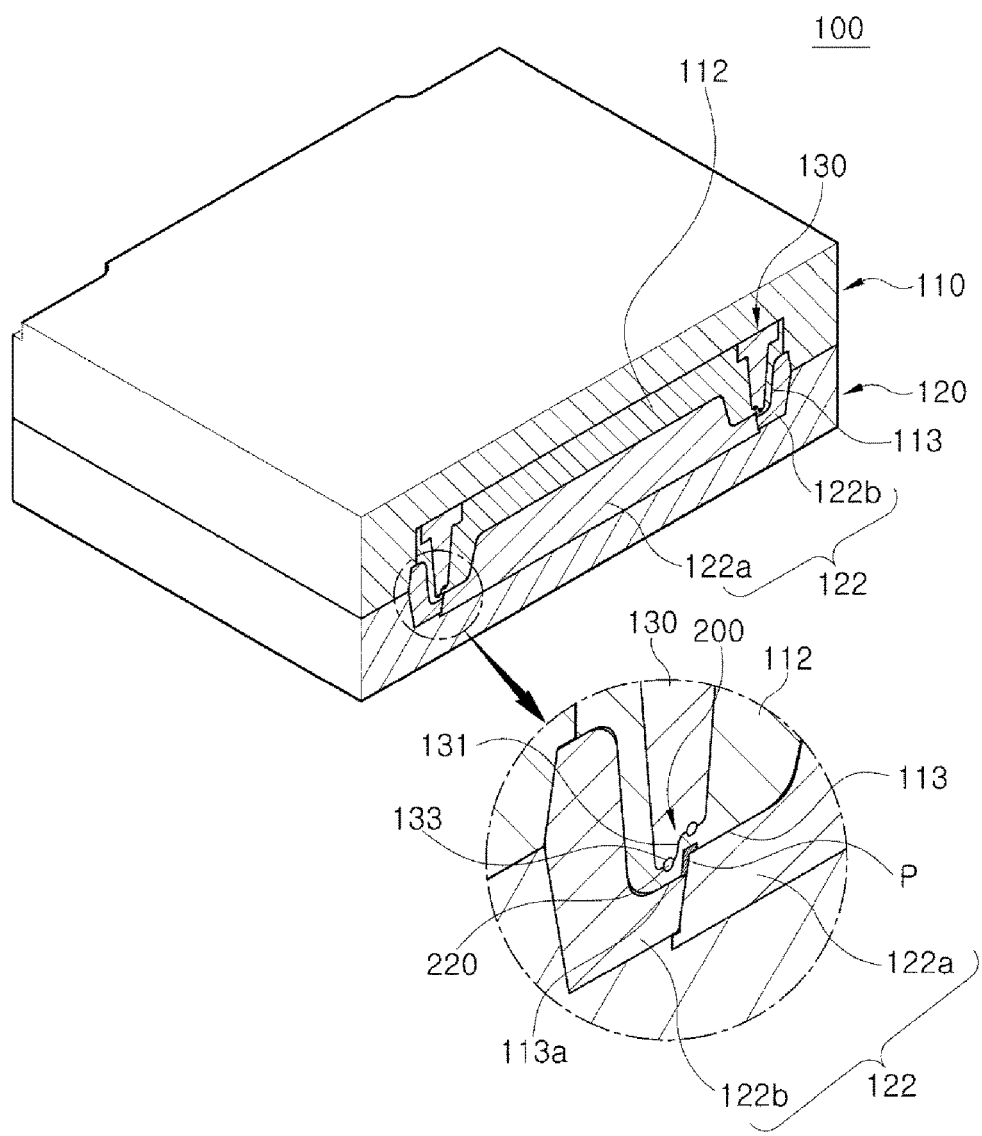
FIG. 5 is a cross-sectional view taken along line A-A' in FIG. 3.
Figure 6:
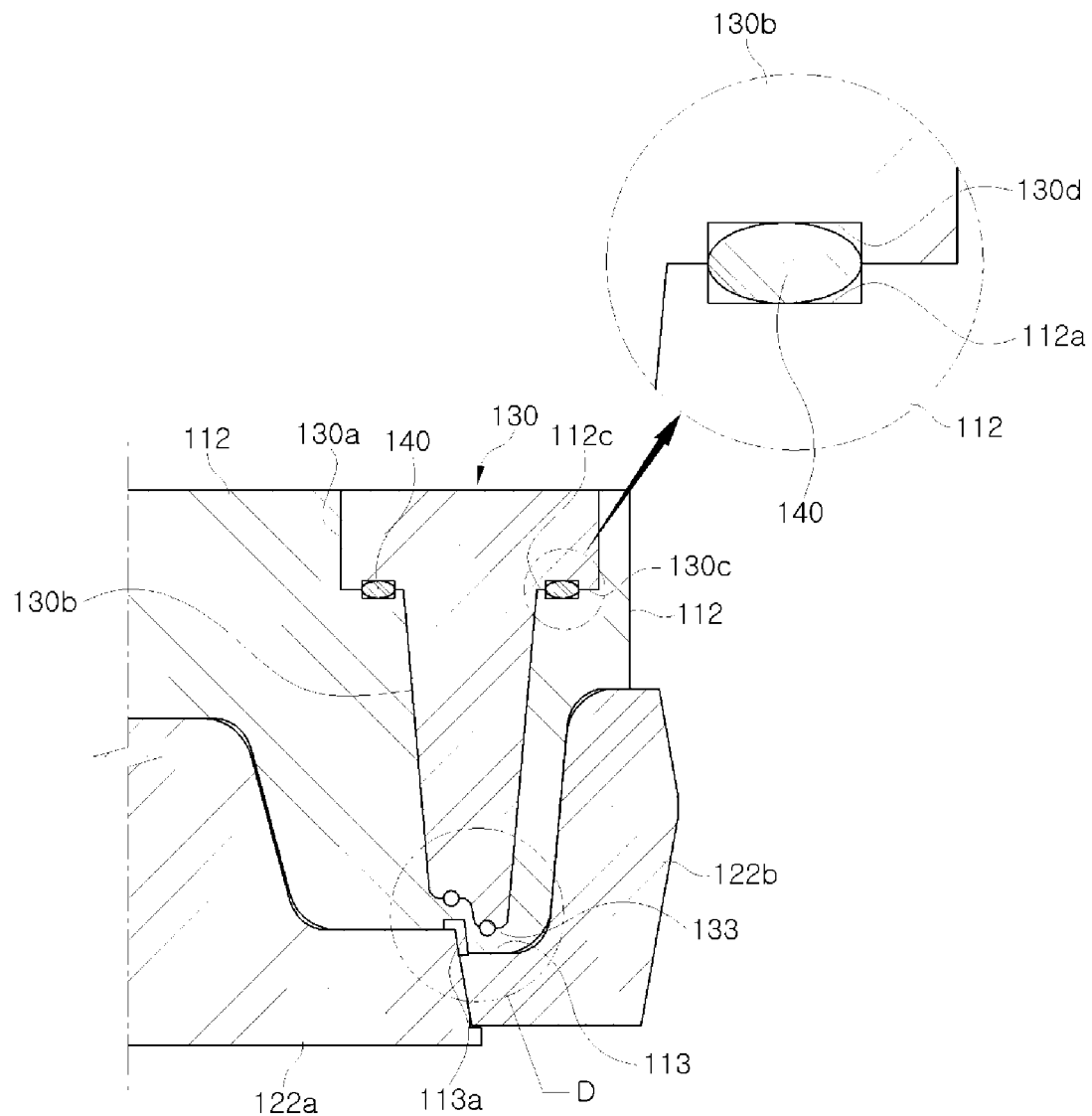
FIG. 6 is an enlarged view illustrating a portion which shows a core mold and a forming mold of the injection molding apparatus according to one embodiment of the embodiments.
Figure 7:
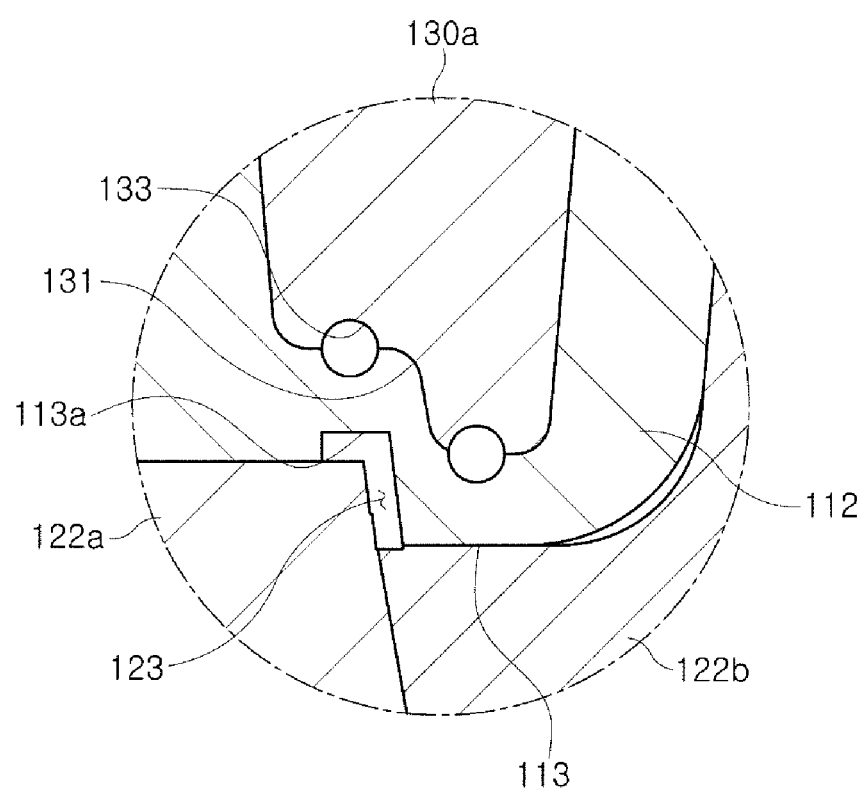
FIG. 7 is an enlarged view of a portion C of FIG. 6.
Figure 8:
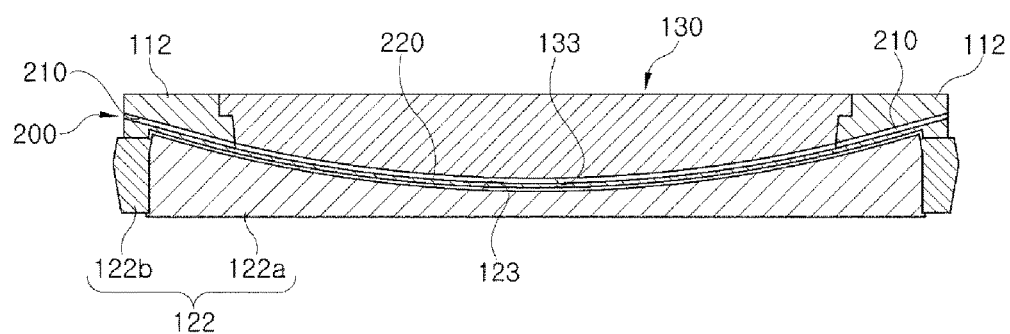
FIG. 8 is a cross-sectional view taken along line B-B' in FIG. 3.
Figure 9:
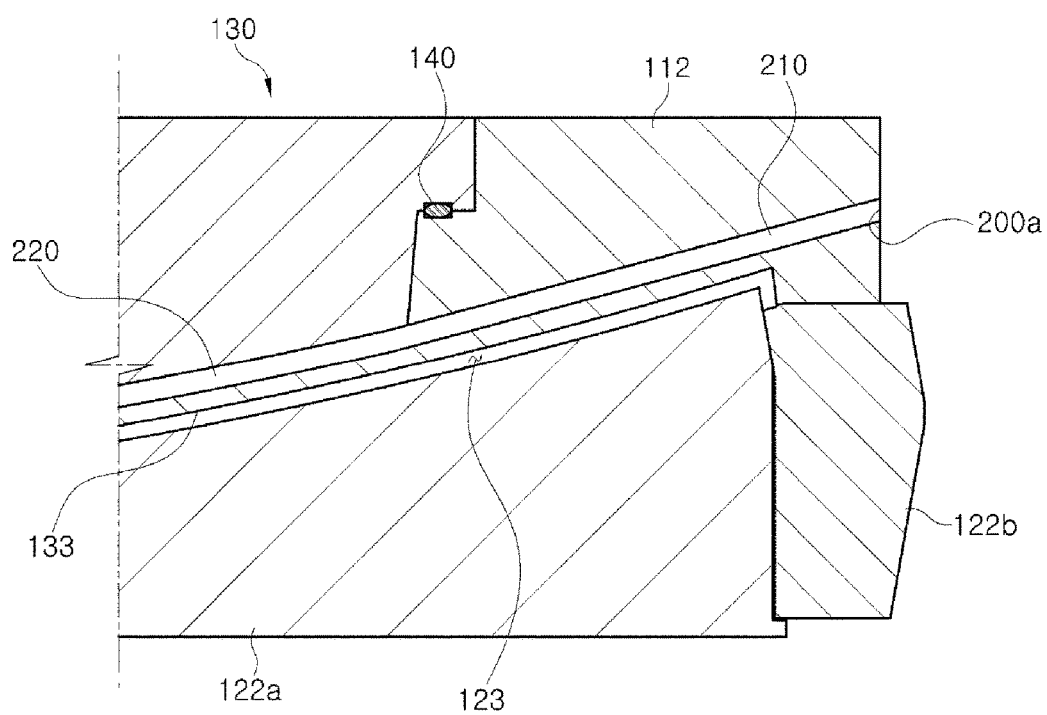
FIG. 9 is an enlarged view schematically illustrating a portion which shows a cooling flow path of the injection molding apparatus according to one embodiment of the embodiments.

FIG. 3 is a schematic view of an injection molding apparatus used for manufacturing of the display apparatus according to one embodiment, FIG. 4 is an exploded perspective view schematically illustrating the injection molding apparatus according to one embodiment, and FIG. 5 is a cross-sectional view taken along line A-A' in FIG. 3;

As illustrated in FIGS. 3 to 5, an injection molding apparatus 100 according to an embodiment is provided to inject the first cover 20a (hereinafter, an injection product P)

which forms a front surface including a curved surface shape of the cover 20 of the display apparatus 1.

The injection molding apparatus 100 includes a first mold portion 110 and a second mold portion 120 which face each other. The second mold portion 120 is provided to couple with the first mold portion 110 below the first mold portion 110.

The first mold portion 110 includes a first mold 111. The first mold 111 includes a core mold 112 in which a curved surface core 113 is formed so that the injection product P is formed in a concave surface shape, and a cooling flow path 200 configured to cool the injection product P.

A curved surface portion 113a configured to inject a front surface portion of the injection product P is formed on the curved surface core 113 of the core mold 112.

The curved surface portion 113a of the curved surface core 113 is provided to form a front surface and a side surface of the injection product P. The front surface and the side surface of the injection product P form an exterior of the injection product P.

The second mold portion 120 includes a second mold 121, and the second mold 121 includes a forming mold 122 provided to be coupled with the first mold 111 to form a rear surface of the injection product P.

The forming mold 122 is provided to be coupled with the curved surface core 113 of the first mold 111 to form a cavity 123. The forming mold 122 may include a first forming mold 122a disposed thereinside and a second forming mold 122b disposed outside the first forming mold 122a.

The first forming mold 122a is provided to form an inner surface of the injection product P, and the second forming mold 122b is provided to form the rear surface of the injection product P.

Accordingly, the front surface and the side surfaces of the injection product P are formed by the curved surface core 113 of the first mold 111, the rear surface of the injection product P is formed by the first forming mold 122a and the second forming mold 122b of the second mold 121.

Meanwhile, even though a resin supplying path configured to supply a plastic resin into the cavity 123 of the second mold 121 is not illustrated in the drawing of the second mold portion 120, the resin supplying path may be connected with and formed in the second mold portion 120.

In the embodiment, it has been illustrated as an example that the forming mold 122 is a family mold including the first forming mold 122a and the second forming mold 122b, but the concept is not limited thereto. For example, the forming mold may be integrally formed to integrally form the inner surface and the rear surface of the injection product.

As illustrated in FIGS. 6 to 9, the injection molding apparatus 100 may include a cooling flow path 200 through which cooling water passes to cool the injection product P.

The cooling flow path 200 includes a first cooling flow path 210 formed in the core mold 112 in a straight line shape, and a second cooling flow path 220 formed close to the curved surface portion 113a of the curved surface core 113 in a curved surface shape.

It is preferable that the first cooling flow path 210 and the second cooling flow path 220 be formed as least one or more paths, that is, a plurality of the paths. In the embodiment, it has been illustrated as an example that the cooling flow path 200 is disposed at each of directions of the front surface and the side surface of the injection product P to cool the front surface and the side surface which form the exterior of the injection product P, but the is not limited thereto. For example, the cooling flow path may also be formed to be disposed in various manners according to a size or a shape of the injection product.

Meanwhile, the first cooling flow path 210 may be disposed in a straight line section formed at upper and lower portions of left and right sides of the core mold 112.

It is preferable that the first cooling flow path 210 be formed in the core mold 112 using a gun drill. In the embodiment, it has been illustrated as an example that the first cooling flow path 210 is formed to laterally pass through the core mold 112, but the concept is not limited thereto. For example, the first cooling flow path may include the cooling flow path formed in a straight line shape section in which the gun drill process is possible, that is, formed in upward and downward directions of the core mold.

The first cooling flow path 210 may further include a cooling water hole 200a formed to receive or discharge cooling water through a cooling water tube (not shown) which is in connection with an outside of the core mold 112. It is preferable that at least one or more of the cooling water holes 200a be formed to include a portion in which cooling water flows and a portion from which the cooling water is discharged so that the cooling water which completes cooling flows in and is discharged.

In addition, the second cooling flow path 220 may be formed in the curved surface core 113 of the core mold 112. The second cooling flow path 220 is formed to communicate with the first cooling flow path 210. The second cooling flow path 220 may also be formed to connect the first cooling flow path 210 formed at a left side in the core mold 112 and the first cooling flow path 210 formed at a right side in the core mold 112.

The second cooling flow path 220 may be formed by an insert block 130 provided on the curved surface core 113.

The insert block 130 is provided in a shape corresponding to the curved surface core 113 of the core mold 112 to be insertable.

An insert block installation space 114 is provided at the curved surface core 113 of the core mold 112 so that the insert block 130 may be inserted. The insert block installation space 114 is formed to communicate with the first cooling flow path 210 of the curved surface core 113.

It is preferable that the insert block installation space 114 be provided so that the insert block 130 is inserted from an upper side into a lower side of the core mold 112.

The second cooling flow path 220 is provided to communicate with the insert block installation space 114, and formed by the insert block 130 being installed into the insert block installation space 114.

The insert block 130 may include a first body 130a and a second body 130b. The second body 130b is formed to extend to an upper end of the first body 130a so that the first body 130a may not be separated from the insert block installation space 114, but may be stably installed therein.

The second body 130b includes a supporting surface 130c formed by being bent from the first body 130a.

A supporting portion 112c is formed on an upper portion of the insert block installation space 114 of the curved surface core 113 to correspond to the supporting surface 130c of the second body 130b.

In addition, a first sealing groove 130d and a second sealing groove 112a are respectively formed in the supporting surface 130c and the supporting portion 112c. The first sealing groove 130d and the second sealing groove 112a are formed to correspond to each other. A sealing member 140 may be provided in each of the first sealing groove 130d and the second sealing groove 112a to prevent cooling water from leaking between the insert block 130 and the insert block installation space 114.

The sealing member 140 may be formed of an elastic material and include a rubber ring.

The insert block 130 includes a curved surface shape portion 131 having a curvature corresponding to a curvature of the curved surface portion 113a of the curved surface core 113, and a cooling flow path shape portion 133 formed in the curved surface shape portion 131. The cooling flow path shape portion 133 may be formed to be recessed in a longitudinal direction in the curved surface shape portion 131 of the insert block 130.

At this time, the curved surface shape portion 131 and the cooling flow path shape portion 133 are preferably formed on a bottom surface of the first body 130a of the insert block 130. The cooling flow path shape portion 133 is formed at a position corresponding to a position at which the cooling flow path shape portion 133 may communicate with the first cooling flow path 210.

Accordingly, the insert block 130 is provided to be installed in the insert block installation space 114 and simultaneously to form the second cooling flow path 220 by the cooling flow path shape portion 133 formed on the bottom surface of the first body 130a, and the second cooling flow path 220 is provided to communicate with the first cooling flow path 210 so that cooling water may flow through the first cooling flow path 210 and the second cooling flow path 220.

Meanwhile, the second cooling flow path 220 formed by the insert block 130 is formed in a shape corresponding to a curvature of the curved surface portion 113a of the curved surface core 113.

Accordingly, since the cooling flow path 200 is formed to be spaced a predetermined interval from the curved surface portion 113a of the curved surface core 113 provided to form the injection product P having a curved surface shape, cooling may be carried out in a constant speed or rate, and thus the product quality may be improved.

In the embodiment, it has been illustrated as an example that the injection molding apparatus 100 including the cooling flow path 200, having a curved surface shape, shapes the first cover 20a of the display apparatus 1, but the concept is not limited thereto. For example, the injection molding apparatus 100 including the cooling flow path 200 having a curved surface shape may be applied to an injection molding for injection products having various shapes including a concave shape recessed in a forward direction.

Meanwhile, it is preferable that the insert block 130 be formed to be smaller than the insert block installation space 114.

Accordingly, when the insert block 130 is inserted into the insert block installation space 114 of the curved surface core 113, a clearance space corresponding to a size difference between the insert block installation space 114 and the insert block 130 is formed in the insert block installation space 114, and the clearance space may communicate with the first cooling flow path 210 to form the second cooling flow path 220.

As is apparent from the above description, a cover of a display apparatus according to one embodiment can keep high gloss to improve quality thereof.

In addition, since the embodiments can form cooling lines of injection mold close to a curved surface and reduce cooling time, there is an effect in that production time is reduced and its manufacturing cost is reduced.

While specific embodiments have been illustrated and described above, the embodiments are not limited to the aforementioned specific embodiments. Those skilled in the art may variously modify the embodiments without departing from the gist of the embodiments.

What is claimed is:

1. A display apparatus, comprising:
a display module which keeps a display panel on which an image is displayed in a curved surface state;
a driving unit provided at a rear side of the display module; and
an accommodation apparatus which accommodates the display module and the driving unit and forms an exterior of the display apparatus,
wherein an apparatus cover is injection molded, and includes:
a first cover which is disposed in front of the display module and is provided to have a same curvature as a display panel curvature of the display panel; and
a second cover which is disposed at a rear side of the display module, is coupled with the first cover, simultaneously accommodates the display module and the driving unit, and is formed to have another curvature which is different from the display panel curvature of the display panel,
wherein the apparatus cover the cover is injection molded by an injection molding apparatus, and the injection molding apparatus includes a first mold configured to form the first cover provided to form a front edge of the display apparatus, and a second mold provided to couple with the first mold, and the first mold includes a curved surface core having a curved surface portion which protrudes to have the first cover form a curved surface having a concave shape recessed in a forward direction, and an insert block which is provided at the curved surface core, and is provided to form a cooling flow path formed in a shape corresponding to the curved surface portion.

2. The display apparatus of claim 1, wherein the apparatus cover is formed of a plastic resin material.

3. The display apparatus of claim 1, wherein the cooling flow path includes a plurality of first cooling flow paths formed in the first mold in a straight line, and a second cooling flow path formed to communicate with the first cooling flow paths via the insert block.

4. The display apparatus of claim 1, wherein the insert block includes a curved surface shape portion formed to have a curvature corresponding to the curved surface portion, and a cooling flow path shape portion formed in the curved surface shape portion.

5. The display apparatus of claim 3, wherein the first mold includes an insert block installation space which communicates with the first cooling flow paths, and the second cooling flow path is formed by inserting the insert block into the insert block installation space.

6. The display apparatus of claim 5, wherein the insert block is formed to be smaller than the insert block installation space.

7. The display apparatus of claim 3, wherein the cooling flow path is formed in the curved surface core.

8. The display apparatus of claim 3, wherein the second cooling flow path is formed to be spaced a predetermined interval from the curved surface portion.

9. The display apparatus of claim 1, wherein the apparatus cover is formed in a curved surface shape having end portions and in which the end portions protrude in a forward direction.

10. The display apparatus of claim 1, wherein a plurality of gates configured to inject a resin solution a resin solution are provided in the second mold.

11. A display apparatus injection molded cover accommodating a curved display and a driving unit, the molded cover comprising:
- a first cover which is positionable at front side of the display module and has a first curvature a same as a display panel curvature of the display; and
- a second cover which is positionable at a rear side of the display, is couplable with the first cover, accommodates the display and the driving unit, and has a second curvature which is different from the first curvature,
- wherein the first cover is injection molded by an injection molding apparatus, and
- the injection molding apparatus includes a first mold configured to form the first cover provided to form a front edge of the display apparatus, and a second mold provided to couple with the first mold, and the first mold includes a curved surface core having a curved surface portion which protrudes to have the first cover form a curved surface having a concave shape recessed in a forward direction, and an insert block which is provided at the curved surface core, and is provided to form a cooling flow path formed in a shape corresponding to the curved surface portion.

* * * * *